United States Patent
Jo et al.

(10) Patent No.: US 10,110,259 B1
(45) Date of Patent: Oct. 23, 2018

(54) BAND SELECTION SWITCH APPARATUS OF POWER AMPLIFIER SYSTEM

(71) Applicant: Samsung Electro-Mechanics Co., Ltd., Suwon-si (KR)

(72) Inventors: Byeong Hak Jo, Suwon-si (KR); Jeong Hoon Kim, Suwon-si (KR); Hyun Paek, Suwon-si (KR); Young Wong Jang, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/815,253

(22) Filed: Nov. 16, 2017

(30) Foreign Application Priority Data

Jun. 12, 2017 (KR) .......................... 10-2017-0073251

(51) Int. Cl.
*H04B 1/00* (2006.01)
*H04B 1/04* (2006.01)
*H03H 9/00* (2006.01)

(52) U.S. Cl.
CPC ........... *H04B 1/006* (2013.01); *H03H 9/0009* (2013.01); *H04B 1/0078* (2013.01)

(58) Field of Classification Search
CPC ........ H04B 1/006; H04B 1/0078; H04B 1/04; H04B 2001/0408; H04B 1/0458; H04B 1/005; H04W 52/52; H03H 9/0009
See application file for complete search history.

(56) References Cited

U.S. PATENT DOCUMENTS

| 5,917,362 | A | 6/1999 | Kohama | |
|---|---|---|---|---|
| 9,124,265 | B2 | 9/2015 | Dykstra | |
| 2007/0232241 | A1* | 10/2007 | Carley | H04B 1/44 455/83 |
| 2008/0247338 | A1* | 10/2008 | Kim | H03F 3/195 370/280 |
| 2013/0023221 | A1* | 1/2013 | Kim | H04B 1/44 455/83 |
| 2013/0187728 | A1* | 7/2013 | Tanji | H01P 1/15 333/103 |
| 2013/0188650 | A1* | 7/2013 | Sugiura | H04B 1/401 370/401 |
| 2014/0113573 | A1* | 4/2014 | Khatri | H03F 1/0277 455/78 |

(Continued)

*Primary Examiner* — Andrew Wendell
(74) *Attorney, Agent, or Firm* — NSIP Law (57) ABSTRACT

A band selection switch apparatus includes: a first switch including a first series switch disposed between a transmission input terminal and a first transmission and reception terminal; a second switch including a second series switch disposed between the transmission input terminal and a first transmission terminal; and a third switch including a third series switch disposed between a first reception output terminal and the first transmission and reception terminal. The first series switch includes a first series switch circuit including first series switch elements connected between the transmission input terminal and a first intermediate node, a second series switch circuit including second series switch elements connected between the first intermediate node and the first transmission and reception terminal, and a first shunt switch circuit including first shunt switch elements connected between the first intermediate node and a ground.

16 Claims, 9 Drawing Sheets

(56) References Cited

U.S. PATENT DOCUMENTS

| | | | |
|---|---|---|---|
| 2016/0065206 A1* | 3/2016 | Ho | H03K 17/687 |
| | | | 455/83 |
| 2016/0080012 A1* | 3/2016 | Sun | H04B 1/0475 |
| | | | 455/114.2 |
| 2016/0227603 A1* | 8/2016 | Huang | H03F 3/211 |
| 2018/0062690 A1* | 3/2018 | Hageraats | H04B 7/0882 |
| 2018/0175797 A1* | 6/2018 | Lee | H03F 1/0205 |

* cited by examiner

BAND SELECTION SWITCH APPARATUS OF POWER AMPLIFIER SYSTEM

CROSS-REFERENCE TO RELATED APPLICATIONS

This application claims benefit under 35 U.S.C. § 119(a) of Korean Patent Application No. 10-2017-0073251 filed on Jun. 12, 2017 in the Korean Intellectual Property Office, the entire disclosure of which is incorporated herein by reference for all purposes.

BACKGROUND

1. Field

The following description relates to a band selection switch apparatus of a power amplifier system.

2. Description of Related Art

In general, a power amplifier module (PAM) amplifies a radio frequency (RF) signal of an output of a transmitter and transmits the amplified RF signal to an antenna. In order to support various frequency bands, the PAM may include a power amplifier (PA), a low noise amplifier (LNA), a band selection switch, filters, and an antenna switch module (ASM).

The filter in the PAM may include a surface acoustic wave (SAW) filter or a bulk acoustic wave (BAW) filter, and is known as a duplexer, triplexer, or a quadplexer, depending on the number of frequency bands which are used.

The band selection switch may have a form determined according to a configuration of the power amplifier (PA) and the filter, and, since the power amplifier (PA) is typically designed in a wide band including multiple bands, the band selection switch may be implemented in a form of single-pole multi-throw switch having a single input and multiple outputs.

However, as the quadplexer and a wideband low nose amplifier (LNA), for example, are developed, a band selection switch having a structure in which a transmission Tx path and a reception Rx path simultaneously enter an active state is required.

In a PAM system in which a conventional triplexer is applied, in a case in which one transmission band (e.g., B1 Tx) and another transmission and reception band (B2 Tx, B2 Rx) are adjacent to each other, the PAM system may be implemented by one filter. In this case, the band selection switch (BSSW) may be implemented in a form of double-pole double-throw (DPDT) switch.

In this case, a signal of a transmission input terminal TX IN may be transmitted to the filter through the band selection switch (BSSW) and a second band transmission terminal B2Tx through the power amplifier (PA). At the same time, a received signal of the filter may be transmitted to the low noise amplifier through a second band reception terminal B2RX and the band selection switch (BSSW).

A conventional band selection switch (BSSW) may include a series switch and a shunt switch on one signal path.

However, in a case in which two different signal paths are simultaneously formed in the active state, the conventional band selection switch (BSSW) has a problem in that isolation characteristics between the two signal paths may be deteriorated.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a band selection switch apparatus includes: a first switch including a first series switch disposed between a transmission input terminal and a first transmission and reception terminal; a second switch including a second series switch disposed between the transmission input terminal and a first transmission terminal; and a third switch including a third series switch disposed between a first reception output terminal and the first transmission and reception terminal. The first series switch includes a first series switch circuit including first series switch elements connected between the transmission input terminal and a first intermediate node, a second series switch circuit including second series switch elements connected between the first intermediate node and the first transmission and reception terminal and configured to perform a switching operation in synchronization with a switching operation performed by the first series switch circuit, and a first shunt switch circuit including first shunt switch elements connected between the first intermediate node and a ground and configured to perform a switching operation complementarily with the switching operation performed by the first series switch circuit.

The first series switch elements may include first to n-th switch elements connected to each other in series, and having a withstand voltage that is higher than a voltage corresponding to a transmission power of the transmission input terminal in an off-state. The second series switch elements may include first to m-th switch elements connected to each other in series, and having a withstand voltage that is higher than a voltage corresponding to a reception power of the transmission and reception terminal in the off-state.

The first shunt switch elements may include first to k-th switch elements connected to each other in series, and having a withstand voltage that is higher than a voltage corresponding to a transmission power of the transmission input terminal in an off-state.

The first series switch elements may include first to n-th switch elements connected to each other in series. The second series switch elements may include first to m-th switch elements connected to each other in series. m may be a natural number of two or more. n may be a natural number greater than m.

The first series switch may further include a third series switch circuit including third series switch elements connected between the second series switch circuit and the first transmission and reception terminal, and configured to perform the switching operation in synchronization with the switching operation performed by the first series switch circuit, and a second shunt switch circuit including second shunt switch elements connected between a connection node between the second series switch circuit and the third series switch circuit, and the ground, and configured to perform the switching operation complementarily with the switching operation performed by the first series switch circuit.

The first series switch elements may include first to n-th switch elements connected to each other in series. The second series switch elements may include first to m-th switch elements connected to each other in series. n may be a natural number of two or more. m may be a natural number greater than n.

The band selection switch apparatus may further include: a fourth switch including a fourth series switch connected between the transmission input terminal and a second transmission and reception terminal; and a fifth series switch connected between the first reception output terminal and the second transmission and reception terminal. The fifth series switch may include a fifth series switch circuit including fifth series switch elements connected between the first reception output terminal and a second intermediate node, a sixth series switch circuit including sixth series switch elements connected between the second intermediate node and the second transmission and reception terminal, and configured to perform the switching operation in synchronization with the switching operation performed by the first series switch circuit, and a fifth shunt switch circuit including fifth shunt switch elements connected between the second intermediate node and the ground, and configured to perform the switching operation complementarily with the switching operation performed by the first series switch circuit.

The first series switch elements may include first to n-th switch elements connected to each other in series, and having a withstand voltage that is higher than a voltage corresponding to a reception power of the first reception output terminal in an off-state. n may be a natural number.

The second series switch elements may include first to m-th switch elements connected to each other in series, and having a withstand voltage that is higher than a voltage corresponding to transmission power of the second transmission and reception terminal in an off-state. m may be a natural number.

The first shunt switch elements may include first to k-th switch elements connected to each other in series, and having a withstand voltage that is higher than a voltage corresponding to transmission power of the second transmission and reception terminal in an off-state. k may be a natural number.

In another general aspect, a band selection switch apparatus includes: a first switch including a first series switch disposed between a transmission input terminal and a first transmission and reception terminal; a second switch including a second series switch disposed between the transmission input terminal and a first transmission terminal; a third switch including a third series switch disposed between a first reception output terminal and the first transmission and reception terminal; a fourth switch including a fourth series switch connected between the transmission input terminal and a second transmission and reception terminal; a fifth series switch connected between the first reception output terminal and the second transmission and reception terminal; and a fifth switch including a sixth series switch disposed between a second reception output terminal and the second transmission and reception terminal. The fifth series switch includes a first series switch circuit including first series switch elements connected between the first reception output terminal and a second intermediate node, a second series switch circuit including second series switch elements connected between the second intermediate node and the second transmission and reception terminal, and configured to perform a switching operation in synchronization with a switching operation performed by the first series switch circuit, and a first shunt switch circuit including first shunt switch elements connected between the second intermediate node and a ground, and configured to perform a switching operation complementarily with the switching operation performed by the first series switch circuit.

The first series switch elements may include first to n-th switch elements connected to each other in series, and having a withstand voltage that is higher than a voltage corresponding a reception power of the first reception output terminal in an off-state. The second series switch elements may include first to m-th switch elements connected to each other in series, and having a withstand voltage that is higher than a voltage corresponding to a transmission power of the second transmission and reception terminal in the off-state. The first shunt switch elements may include first to k-th switch elements connected to each other in series, and having the withstand voltage that is higher than the voltage corresponding the transmission power of the second transmission and reception terminal in the off-state. n, m, and k may be natural numbers.

The first series switch elements may include first to n-th switch elements connected to each other in series. The second series switch elements may include first to m-th switch elements connected to each other in series. n may be a natural number of two or more. m may be a natural number greater than n.

The fifth series switch may further include a third series switch circuit including third series switch elements connected between the second series switch circuit and the second transmission and reception terminal, and configured to perform a switching operation in synchronization with the switching operation performed by the first series switch circuit, and a second shunt switch circuit including second shunt switch elements connected between a connection node between the second series switch circuit and the third series switch circuit, and the ground, and configured to perform a switching operation complementarily with the switching operation of the first series switch circuit.

The transmission input terminal may be connected to a power amplifier. The first reception output terminal and the second reception output terminal may be connected to a low noise amplifier. The first transmission and reception terminal and the first transmission terminal may be connected to a filter circuit.

The first transmission and reception terminal may be configured to transmit and receive signals in a first band. The second transmission and reception terminal may be configured to transmit and receive signals in a second band. The first transmission terminal may be configured to transmit signals in a third band.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or wafer (substrate), is described as being "on," "connected to," or "coupled to" another element, it can be directly "on," "connected to," or "coupled to" the other element, or there may be other elements intervening therebetween. In contrast, when an element is referred to as being "directly on," "directly connected to," or "directly coupled to" another element, there can be no other elements or layers intervening therebetween. As used herein, the term "and/or" includes any and all combinations of one or more of the associated listed items.

As used herein, the term "and/or" includes any one and any combination of any two or more of the associated listed items.

Although terms such as "first," "second," and "third" maybe used herein to describe various members, components, regions, layers, and/or sections, these members, components, regions, layers, and/or sections are not to be limited by these terms. Rather, these terms are only used to distinguish one member, component, region, layer, or section from another member, component, region, layer, or section. Thus, a first member, component, region, layer, or section referred to in an example below could also be referred to as a second member, component, region, layer, or section without departing from the teachings of the example.

Spatially relative terms, such as "above," "upper," "below," and "lower," may be used herein for ease of description to describe one element's relationship to another element as shown in the figures. Such spatially relative terms are intended to encompass different orientations of the device in use or operation in addition to the orientation depicted in the figures. For example, if the device in the figures is turned over, elements described as "above" or "upper" relative to other elements would then be oriented "below" or "lower" relative to the other elements. Thus, the term "above" can encompass both the above and below orientations depending on a particular direction of the figures. The device may be otherwise oriented (rotated 90 degrees or at other orientations), and the spatially relative terms used herein are to be interpreted accordingly.

The terminology used herein is for describing particular examples only, and is not intended to limit the disclosure. The terms "a," "an," and "the" include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, Variations of the shapes shown in the drawings maybe occur. Thus, the examples described below are not to be construed as being limited to the particular shapes of regions shown in the drawings, but include changes in shape occurring during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 1:
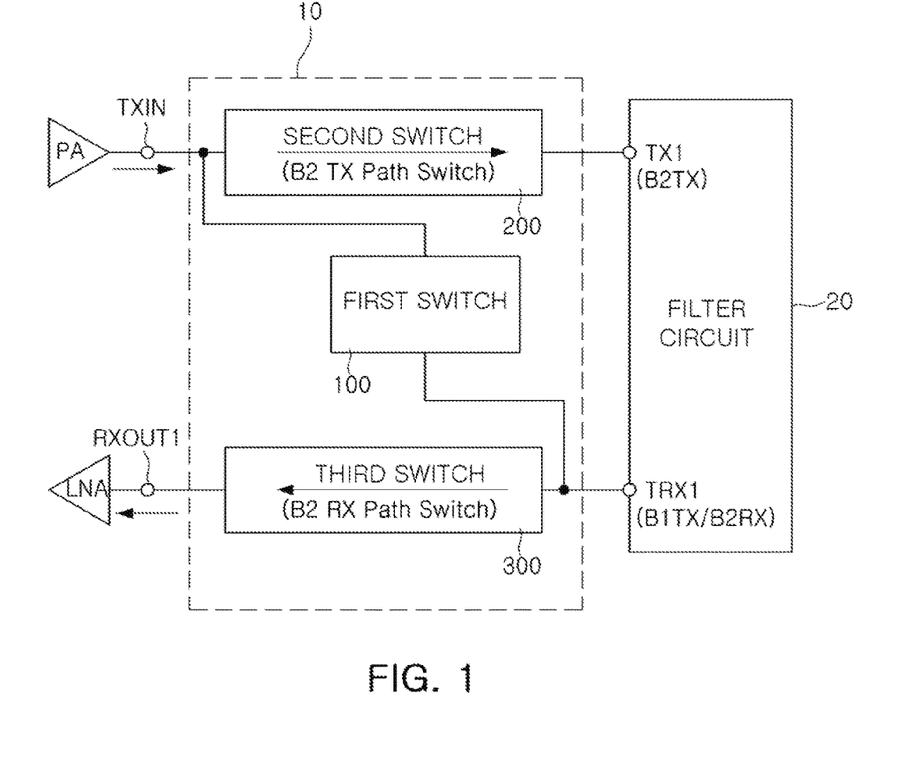
FIG. 1 is a block diagram of a band selection switch apparatus, according to an embodiment.
Figure 2:
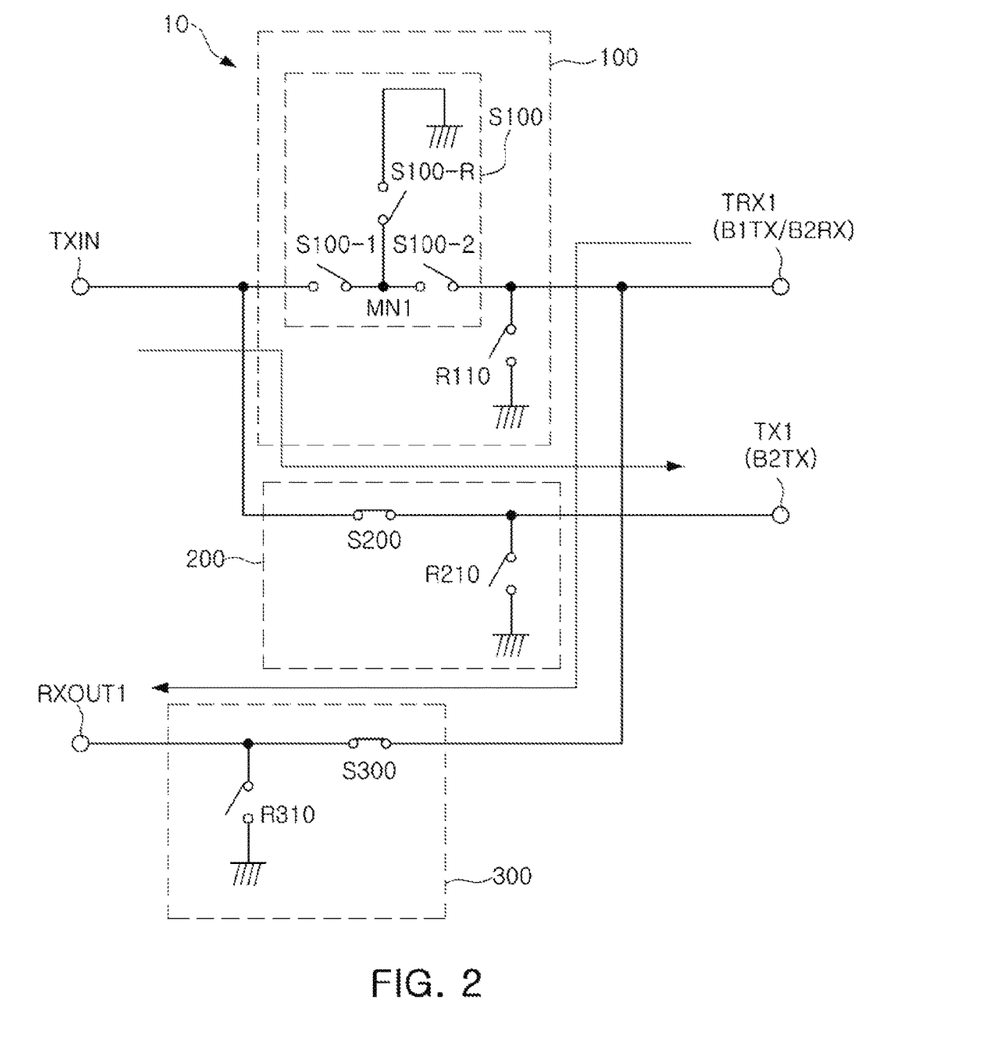
FIG. 2 is a circuit diagram of the band selection switch apparatus of FIG. 1, according to an embodiment.

FIG. 1 is a block diagram of a band selection switch apparatus 10, according to an embodiment. FIG. 2 is a circuit diagram of the band selection switch apparatus 10.

Referring to FIGS. 1 and 2, the band selection switch apparatus 10 includes a first switch 100, a second switch 200, and a third switch 300.

The first switch 100 is disposed between a transmission input terminal TXIN and a first transmission and reception terminal TRX1.

The second switch 200 is disposed between the transmission input terminal TXIN and a first transmission terminal TX1.

The third switch 300 is disposed between a first reception output terminal RXOUT1 and the first transmission and reception terminal TRX1.

The transmission input terminal TXIN is connected to a power amplifier (PA) and is input with a signal from the power amplifier (PA). The first reception output terminal RXOUT1 is connected to a low noise amplifier (LNA) and outputs a signal to the low noise amplifier (LNA). In addition, the first transmission and reception terminal TRX1 and the first transmission terminal TX1 are connected to a filter circuit 20. The first transmission terminal TX1 receives the signal that is input to the transmission input terminal TXIN, and outputs the received signal to the filter circuit 20. The filter circuit 20 uses a filter having a structure suitable for the number of used bands, for example, a triplexer or a quadplexer.

In FIG. 1, the second switch 200 and the third switch 300 may simultaneously be in an on-state (an active state), the second switch 200 transmits a signal that passes through the second band transmission terminal B2TX, and the third switch 300 transmits a signal that passes through the second band reception terminal B2RX.

In this case, the first switch 100 is formed as illustrated in FIG. 2 in order to prevent a reduction of isolation characteristics between the second switch 200, which is connected to the transmission input terminal TXIN and the third switch 300, which is connected to the first transmission and reception terminal TRX1.

Herein, the active state is a state in which the paths that are connectable to each other by a switch are connected to each other to transmit the signal.

Referring to FIG. 2, the first switch 100 includes a first series switch S100 disposed between the transmission input terminal TXIN and the first transmission and reception terminal TRX1 (B1TX/B2RX). In addition, the first switch 100 includes a first shunt switch R110 connected between a connection node between the first transmission and reception terminal TRX1 (B1TX/B2RX) and the first series switch S100, and a ground. The first shunt switch R110 performs a switching operation complementarily with the first series switch S100.

The second switch 200 includes a second series switch S200 disposed between the transmission input terminal TXIN and the first transmission terminal TX1 (B2TX). In addition, the second switch 200 includes a second shunt switch R210 connected between a connection node between the first transmission terminal TX1 (B2TX) and the second series switch S200, and the ground. The second shunt switch R210 performs a switching operation complementarily with the second series switch S200.

The third switch 300 includes a third series switch S300 disposed between the first reception output terminal RXOUT1 and the first transmission and reception terminal TRX1 (B1TX/B2RX). In addition, the third switch 300 includes a third shunt switch R310 connected between a connection node between the first reception output terminal RXOUT1 and the third series switch S300, and the ground. The third shunt switch R310 performs a switching operation complementarily with the third series switch S300.

The first series switch S100 includes a first series switch circuit S100-1, a second series switch circuit S100-2, and a first shunt switch circuit S100-R.

The first series switch circuit S100-1 includes switch elements connected between the transmission input terminal TXIN and a first intermediate node MN1.

The second series switch circuit S100-2 includes switch elements connected between the first intermediate node MN1 and the first transmission and reception terminal TRX1, and performs a switching operation in synchronization with a switching operation of the first series switch circuit S100-1.

The first shunt switch circuit S100-R includes switch elements connected between the first intermediate node MN1 and the ground, and performs a switching operation complementarily with the switching operation of the first series switch circuit S100-1.

In addition, in FIGS. 1 and 2, the power amplifier (PA) is connected to the transmission input terminal TXIN and the low noise amplifier (LNA) is connected to the first reception output terminal RXOUT1. The first transmission terminal TX1 is the second band transmission terminal B2TX, and the first transmission and reception terminal TRX1 is the first band transmission terminal B1TX and the second band reception terminal B2RX.

For example, in the first series switch S100, in a case in which the first series switch circuit S100-1 and the second series switch circuit S100-2 simultaneously enter the on-state (the active state), the first shunt switch circuit S100-R is in an off-state.

On the contrary, in a case in which the first series switch circuit S100-1 and the second series switch circuit S100-2 simultaneously enter the off-state (a non-active state), the first shunt switch circuit S100-R is in the on-state (the active state). In this case, the first shunt switch circuit S100-R, being in the on-state, prevents isolation characteristics between the transmission input terminal TXIN and the first transmission and reception terminal TRX1 from being deteriorated.

In the respective drawings of this disclosure, unnecessary overlapping descriptions are possibly omitted for components having the same reference numeral and the same function, and, primarily, differences in the respective drawings will be described.

Figure 3:
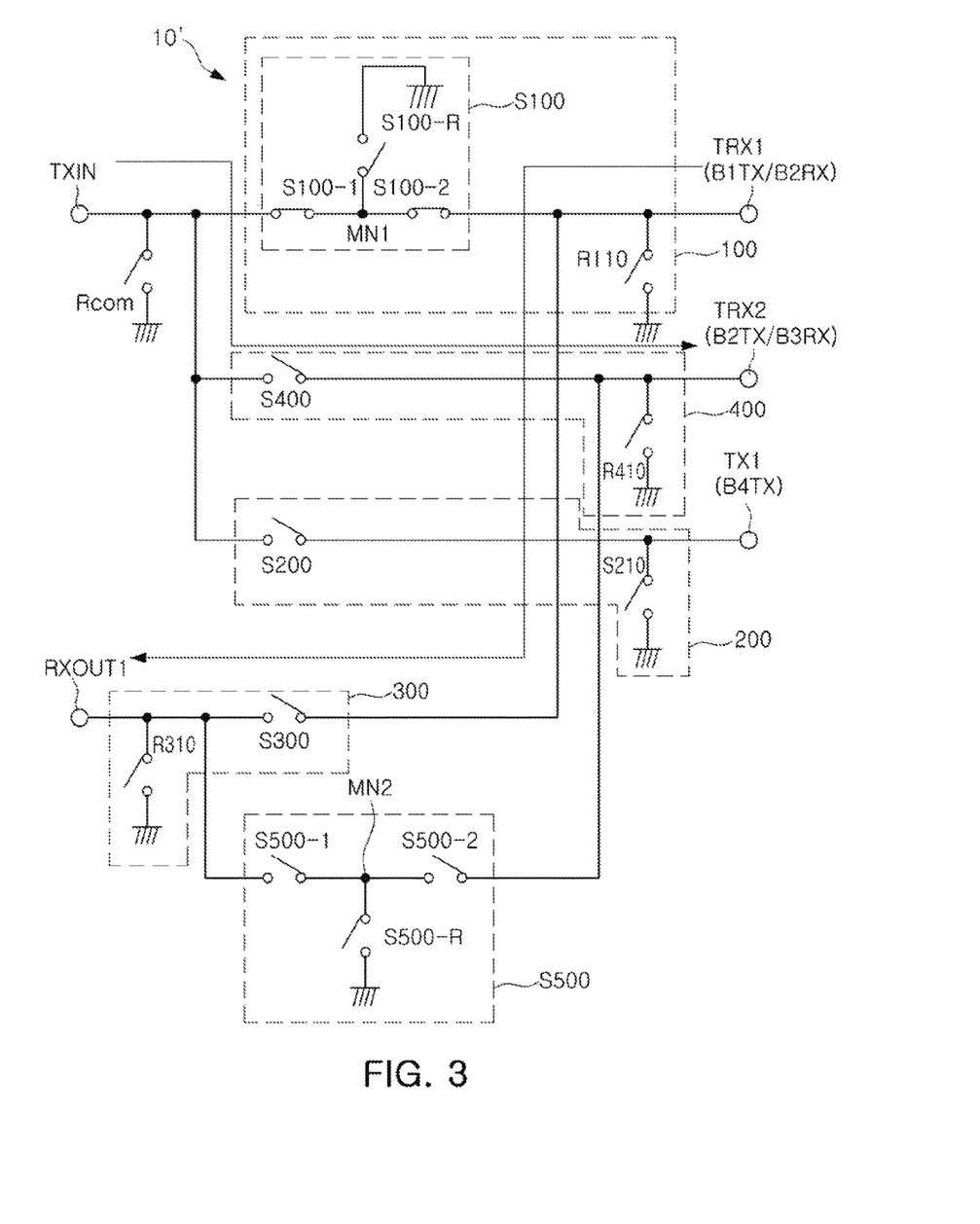
FIG. 3 is a circuit diagram of a band selection switch apparatus, according to another embodiment.

FIG. 3 is a circuit diagram of a band selection switch apparatus 10', according to another embodiment.

Referring to FIG. 3, the band selection switch apparatus 10' further includes a fourth switch 400 including a fourth series switch S400 and a fourth shunt switch R410, and a fifth series switch S500, in addition to the circuit illustrated in FIG. 2.

The fourth series switch S400 of the fourth switch 400 is connected between the transmission input terminal TXIN and the second transmission and reception terminal TRX2 (B2TX/B3RX). The fourth shunt switch R410 is connected between a connection node between the second transmission and reception terminal TRX2 (B2TX/B3RX) and the fourth series switch S400, and the ground. The fourth shunt switch R410 performs a switching operation complementarily with the fourth series switch S400.

The fifth series switch S500 is connected between the first reception output terminal RXOUT1 and the second transmission and reception terminal TRX2 (B2TX/B3TX).

In FIG. 3, the second transmission and reception terminal TRX2 is the second band transmission terminal B2TX and a third band reception terminal B3RX. The first transmission terminal TX1 may be a fourth band transmission terminal B4TX.

The fifth series switch S500 includes a first series switch circuit S500-1, a second series switch circuit S500-2, and a first shunt switch circuit S500-R.

The first series switch circuit S500-1 includes switch elements connected between the first reception output terminal RXOUT1 and a second intermediate node MN2.

The second series switch circuit S500-2 includes switch elements connected between the second intermediate node MN2 and the second transmission and reception terminal TRX2, and performs a switching operation in synchronization with a switching operation of the first series switch circuit S500-1.

The first shunt switch circuit S500-R includes switch elements connected between the second intermediate node MN2 and the ground, and performs a switching operation complementarily with the switching operation of the first series switch circuit S500-1.

In FIG. 3, a power amplifier is connected to the transmission input terminal TXIN, and a low noise amplifier is connected to the first reception output terminal RXOUT1. The first transmission terminal TX1 is the fourth band transmission terminal B4TX. The first transmission and reception terminal TRX1 is the first band transmission terminal B1TX and the second band reception terminal B2RX. The second transmission and reception terminal TRX2 is the second band transmission terminal B2TX and the third band reception terminal B3RX.

In addition, in FIG. 3, the band selection switch further includes a common shunt switch Rcom connected to the transmission input terminal TXIN.

For example, since a description of an operation of the first series switch S100 illustrated in FIG. 3 is the same as the description of the operation of the first series switch S100 illustrated in FIG. 2, a repeated description of the operation of the first series switch S100 will be omitted.

In the fifth series switch S500 of FIG. 3, in a case in which the first series switch circuit S500-1 and the second series switch circuit S500-2 simultaneously enter the on-state (the active state), the first shunt switch circuit S500-R is in the off-state.

On the contrary, in a case in which the first series switch circuit S500-1 and the second series switch circuit S500-2 simultaneously enter the off-state (the non-active state), the first shunt switch circuit S500-R is in the on-state (the active state). In this case, the first shunt switch circuit S500-R, being in the on-state, prevents isolation characteristics between the second transmission and reception terminal TRX2 and the first reception output terminal RXOUT1 from being deteriorated.

Figure 4:
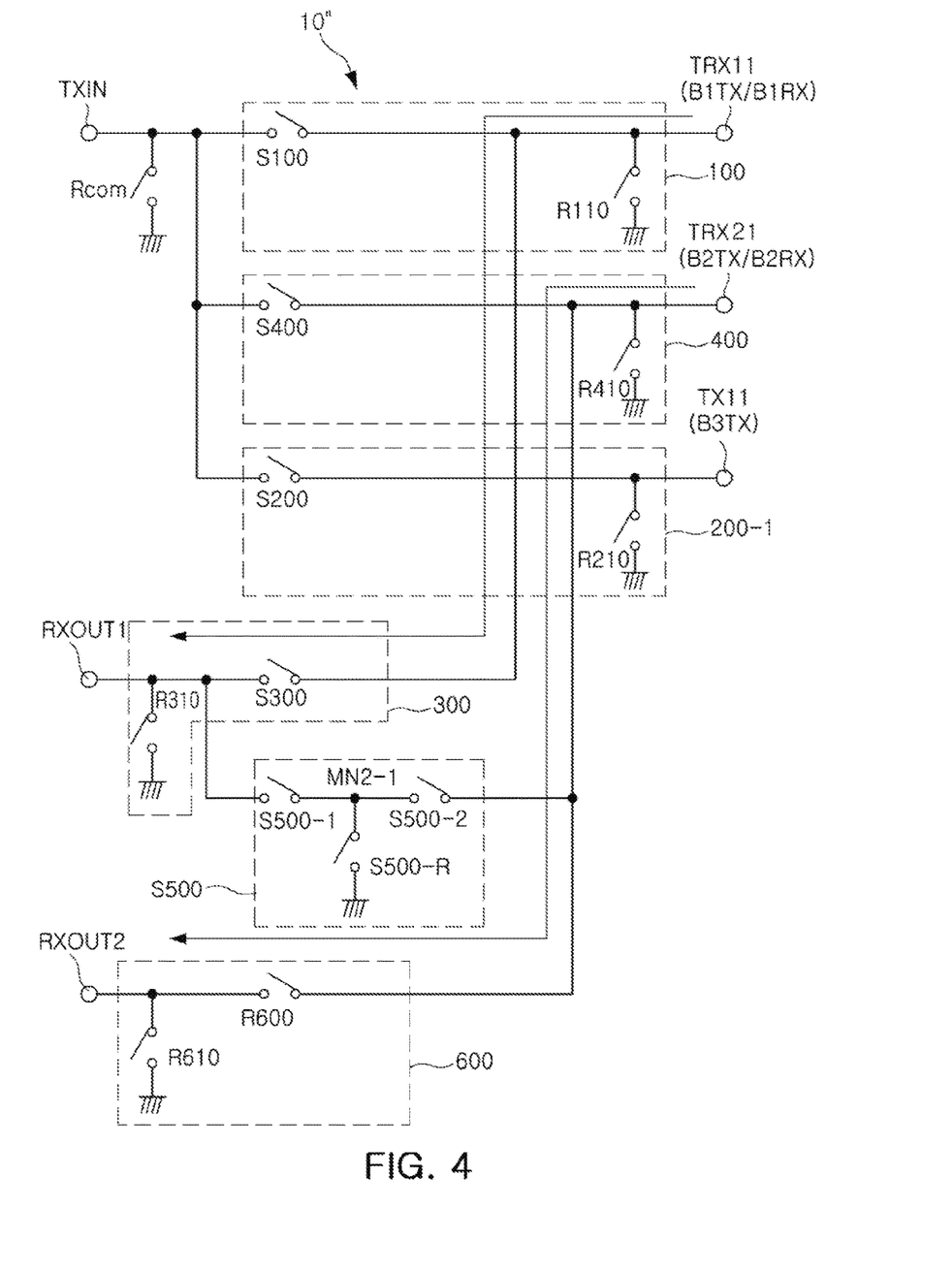
FIG. 4 is a circuit diagram of a band selection switch apparatus, according to another embodiment.

FIG. 4 is a circuit diagram of a band selection switch apparatus 10", according to another embodiment.

Referring to FIG. 4, the band selection switch apparatus 10" includes the first switch 100 including the first series switch S100, the second switch 200 including the second series switch S200, the third switch 300 including the third series switch S300, the fourth switch 400 including the fourth series switch S400, the fifth series switch S500, and a fifth switch 600 including a sixth series switch S600 and a sixth shunt switch R610.

The first series switch S100 of the first switch 100 is disposed between the transmission input terminal TXIN and a first transmission and reception terminal TRX11 (B1TX/B1RX).

The second series switch S200 of the second switch 200 is disposed between the transmission input terminal TXIN and a first transmission terminal TX11 (B3TX).

The third series switch S300 of the third switch 300 is disposed between the first reception output terminal RXOUT1 and the first transmission and reception terminal TRX11.

The fourth series switch S400 of the fourth switch 400 is connected between the transmission input terminal TXIN and a second transmission and reception terminal TRX21 (B2TX/B2RX).

The fifth series switch S500 is connected between the first reception output terminal RXOUT1 and the second transmission and reception terminal TRX21.

The sixth series switch S600 of the fifth switch 600 is disposed between the second reception output terminal RXOUT2 and a second transmission and reception terminal TRX21. The sixth shunt switch R610 performs a switching operation complementarily with the sixth series switch S600.

The fifth series switch S500 includes a first series switch circuit S500-1, a second series switch circuit S500-2, and a first shunt switch circuit S500-R.

The first series switch circuit S500-1 includes switch elements connected between the first reception output terminal RXOUT1 and a second intermediate node MN2-1.

The second series switch circuit S500-2 includes switch elements connected between the second intermediate node MN2-1 and the second transmission and reception terminal TRX21, and performs a switching operation in synchronization with a switching operation of the first series switch circuit S500-1.

In addition, the first shunt switch circuit S500-R includes switch elements connected between the second intermediate node MN2-1 and the ground, and performs a switching operation complementarily with the switching operation of the first series switch circuit S500-1.

In FIG. 4, a power amplifier (e.g. PA inn FIG. 2) may be connected to the transmission input terminal TXIN, and a low noise amplifier (e.g., LNA in FIG. 2) may be connected to each of the first reception output terminal RXOUT1 and the second reception output terminal RXOUT2. The first transmission terminal TX11 is the third band transmission terminal B3TX. The first transmission and reception terminal TRX11 is the first band transmission terminal B1TX and the first band reception terminal B1RX. The second transmission and reception terminal TRX21 is the second band transmission terminal B2TX and the second band reception terminal B2RX.

In addition, in FIG. 4, the band selection switch apparatus 10" includes a common shunt switch Rcom connected to the transmission input terminal TXIN.

For example, in the fifth series switch S500 of FIG. 4, in a case in which the first series switch circuit S500-1 and the second series switch circuit S500-2 simultaneously enter the on-state (the active state), the first shunt switch circuit S500-R is in the off-state.

On the contrary, in a case in which the first series switch circuit S500-1 and the second series switch circuit S500-2 simultaneously enter the off-state (the non-active state), the first shunt switch circuit S500-R is in the on-state (the active state). In this case, the first shunt switch circuit S500-R, being in the on-state, prevents isolation characteristics between the second transmission and reception terminal TRX21 and the first reception output terminal RXOUT1 from being deteriorated.

Figure 5:
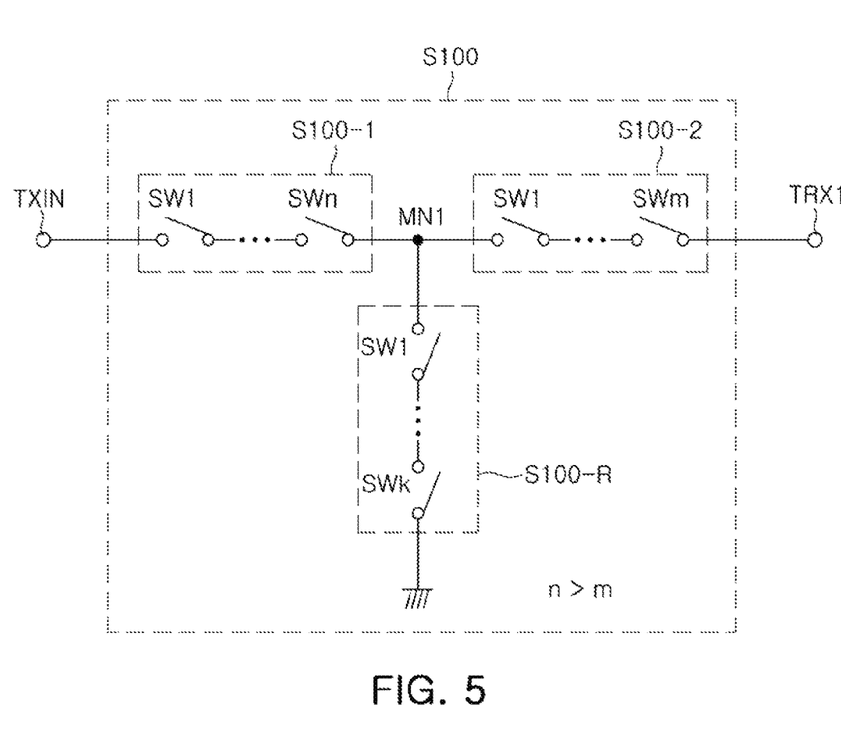
FIG. 5 is a diagram of a first series switch, according to an embodiment.

FIG. 5 is an illustrative diagram of the first series switch S-100, according to an embodiment.

Referring to FIG. 5, the first series switch circuit S100-1 includes first to n-th switch elements SW1 to SWn which are connected to each other in series, and the number of the first to n-th switch elements SW1 to SWn connected to each other is determined so that the first to n-th switch elements SW1 to SWn have a withstand voltage that is higher than a voltage corresponding to transmission power of the transmission input terminal TXIN in a case in which all of the first to n-th switch elements SW1 to SWn are in the off-state.

For example, in a case in which an output voltage of the power amplifier (PA) is 31.5 [dBm] and a margin thereof is 2.5 [dBm], power capability is 34 [dBm], which corresponds to approximately 2.5 [Watts]. When output impedance of the power amplifier is 50 ohms, 2.5 [Watts] corresponds to 15.85[Vpeak], and in a case in which the withstand voltage of one switch element is 2.5V, the first series switch circuit S100-1 requires seven switch elements.

The second series switch circuit S100-2 includes first to m-th switch elements SW1 to SWm which are connected to each other in series, and a number of the first to m-th switch elements SW1 to SWm connected to each other is determined so that the first to m-th switch elements SW1 to SWm have the withstand voltage that is higher than a voltage corresponding to reception power of the transmission and reception terminal B1TX/B2RX in a case in which all of the first to m-th switch elements SW1 to SWm are in the off-state.

The first shunt switch circuit S100-R includes first to k-th switch elements SW1 to SWk connected to each other in series, and a number of the first to k-th switch elements SW1 to SWk is determined so that the first to k-th switch elements SW1 to SWk have a withstand voltage higher than the voltage corresponding to the transmission power of the transmission input terminal TXIN in a case in which all of the first to k-th switch elements SW1 to SWk are in the off-state.

In a case in which the number of the first to n-th switch elements SW1 to SWn included in the first series switch circuit S100-1 is n and the number of the first to m-th switch elements SW1 to SWm included in the second series switch circuit S100-2 is m, n is a natural number greater than m.

That is, since the first series switch circuit S100-1 has the transmission power higher than the reception power, the first series switch circuit S100-1 includes a larger number of switch elements than the number of switch elements of the second series switch circuit S100-2.

For example, in the first series switch S100 of FIG. 5, in a case in which all the switch elements SW1 to SWn and SW1 to SWm of the first series switch circuit S100-1 and the second series switch circuit S100-2, respectively, simultaneously enter the on-state (the active state), all the switch elements SW1 to SWk of the first shunt switch circuit S100-R are in the off-state.

On the contrary, in a case in which all the switch elements SW1 to SWn and SW1 to SWm of the first series switch circuit S100-1 and the second series switch circuit S100-2, respectively, simultaneously enter the off-state (the non-active state), all the switch elements SW1 to SWk of the first shunt switch circuit S100-R are in the on-state (the active state). In this case, the first shunt switch circuit S100-R, being in the on-state, prevents isolation characteristics between the first transmission and reception terminal TRX1 and the transmission input terminal TXIN from being deteriorated.

Figure 6:
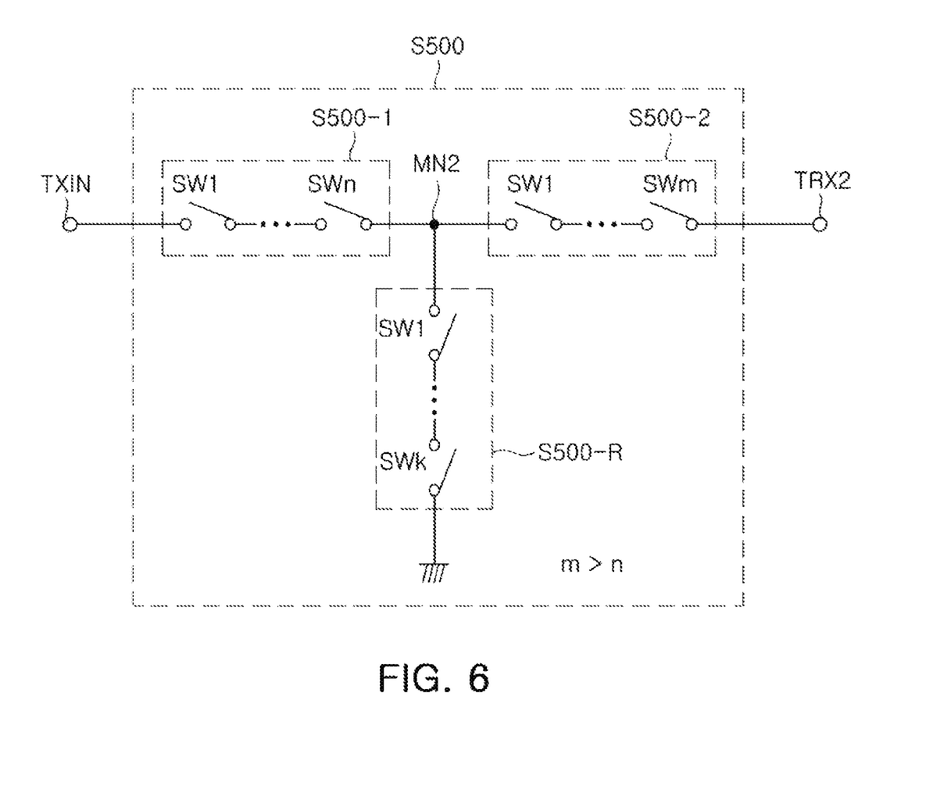
FIG. 6 is a diagram of a fifth series switch of FIG. 3, according to an embodiment.

FIG. 6 is an illustrative diagram of the fifth series switch S500 of FIG. 3, according to an embodiment.

Referring to FIGS. 3 and 6, the first series switch circuit S500-1 includes the first to n-th switch elements SW1 to SWn, which are connected to each other in series, and the number of the first to n-th switch elements SW1 to SWn is determined so that the first to n-th switch elements SW1 to SWn have a withstand voltage that is higher than the voltage corresponding to reception power of the first reception outer terminal RXOUT1 in a case in which all of the first to n-th switch elements are in the off-state.

The second series switch circuit S500-2 includes the first to m-th switch elements SW1 to SWm, which are connected to each other in series, and the number of the first to m-th switch elements SW1 to SWm is determined so that the first to m-th switch elements SW1 to SWm have a withstand voltage that is higher than a voltage corresponding to transmission power of the second transmission and reception terminal TRX2 in a case in which all of the first to m-th switch elements are in the off-state.

The first shunt switch circuit S500-R includes the first to k-th switch elements SW1 to SWk, which are connected to each other in series, and the number of the first to k-th switch elements SW1 to SWk is determined so that the first to k-th switch elements SW1 to SWk have a withstand voltage that is higher than the voltage corresponding to the transmission power of the second transmission and reception terminal TRX2 in a case in which all of the first to k-th switch elements are in the off-state.

In a case in which the number of the first to n-th, switch elements SW1 to SWn included in the first series switch circuit S500-1 is n, where n is a natural number of two or more, and the number of the first to m-th switch elements SW1 to SWm included in the second series switch circuit S500-2 is m, where m is a natural number of two or more, m is greater than n.

That is, the second series switch circuit S500-2 includes a larger number of switch elements than the number of switch elements of the first series switch circuit S500-1.

For example, in the fifth series switch S500 of FIG. 6, in a case in which all the switch elements SW1 to SWn and SW1 to SWm of the first series switch circuit S500-1 and the second series switch circuit S500-2, respectively, simultaneously enter the on-state (the active state), all the switch elements SW1 to SWk of the first shunt switch circuit S500-R are in the off-state.

On the contrary, in a case in which all the switch elements SW1 to SWn and SW1 to SWm of the first series switch circuit S500-1 and the second series switch circuit S500-2, respectively, simultaneously enter the off-state (the non-active state), all the switch elements SW1 to SWk of the first shunt switch circuit S500-R are in the on-state (the active state). In this case, the first shunt switch circuit S500-R, being in the on-state, prevents isolation characteristics between the second transmission and reception terminal TRX2 and the transmission input terminal TXIN from being deteriorated.

Figure 7:
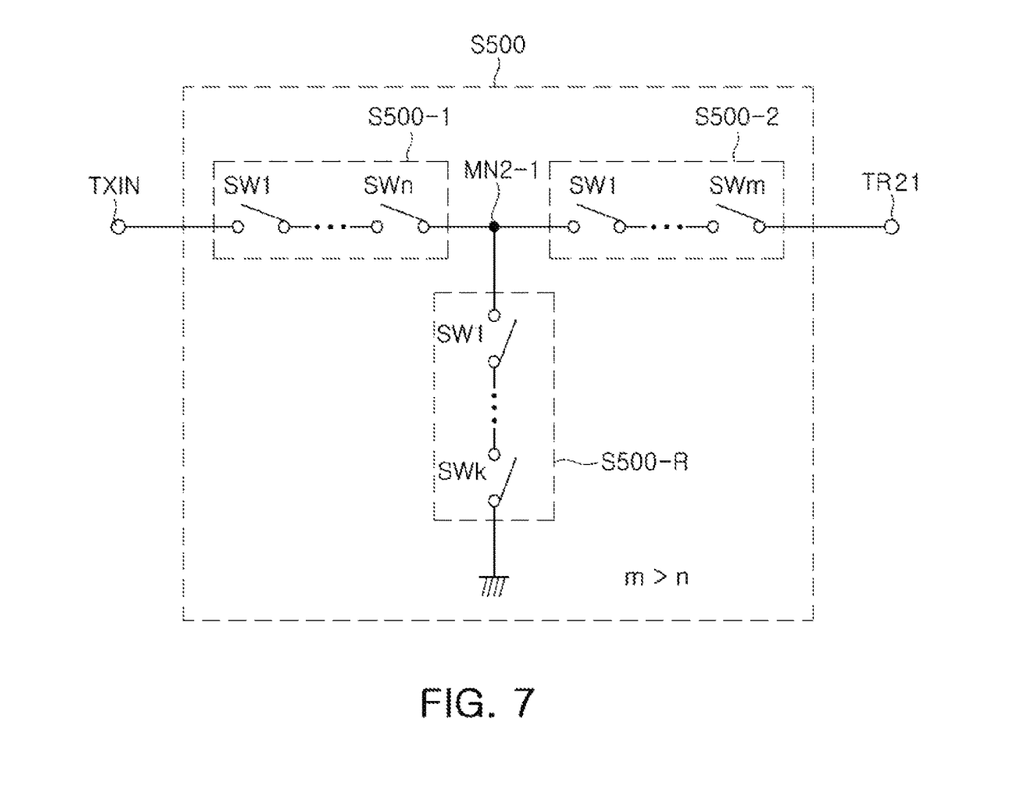
FIG. 7 is a diagram of a fifth series switch of FIG. 4, according to an embodiment.

FIG. 7 is another illustrative diagram of the fifth series switch S500 of FIG. 4.

Referring to FIGS. 4 and 7, the first series switch circuit S500-1 includes the first to n-th switch elements SW1 to SWn, which are connected to each other in series, and the number of the first to n-th switch elements SW1 to SWn is determined so that the first to n-th switch elements SW1 to SWn have a withstand voltage higher than the voltage corresponding to the reception power of the first reception output terminal RXOUT1 in a case in which all of the first to n-th switch elements SW1 to SWn are in the off-state.

The second series switch circuit S500-2 includes the first to m-th switch elements SW1 to SWm, which are connected to each other in series, and the number of the first to m-th switch elements SW1 to SWm is determined so that the first to m-th switch elements SW1 to SWm have a withstand voltage higher than a voltage corresponding to transmission power of the second transmission and reception terminal TRX21 in a case in which all of the first to m-th switch elements SW1 to SWm are in the off-state.

The first shunt switch circuit S500-R includes the first to k-th switch elements SW1 to SWk, which are connected to each other in series, and the number of the first to k-th switch elements SW1 to SWk is determined so that the first to k-th switch elements SW1 to SWk have a withstand voltage higher than the voltage corresponding to the transmission power of the second transmission and reception terminal TRX21 in a case in which all of the first to k-th switch elements SW1 to SWk are in the off-state.

In a case in which the number of the first to n-th switch elements SW1 to SWn included in the first series switch circuit S500-1 is n (n being natural number two or more) and the number of first to m-th switch elements SW1 to SWm included in the second series switch circuit S500-2 is m (m being a natural number two or more), m is greater than n.

That is, the second series switch circuit S500-2 includes a larger number of switch elements than a number of the switch elements of the first series switch circuit S500-1.

For example, in the fifth series switch S500 of FIG. 7, in a case in which all the switch elements of the first series switch circuit S500-1 and the second series switch circuit S500-2 simultaneously enter the on-state (the active state), all the switch elements of the first shunt switch circuit S500-R may be in the off-state.

On the contrary, in a case in which all the switch elements SW1 to SWn and SW1 to SWm of the first series switch circuit S500-1 and the second series switch circuit S500-2, respectively, simultaneously enter the off-state (the non-active state), all the switch elements SW1 to SWk of the first shunt switch circuit S500-R are in the on-state (the active state). In this case, the first shunt switch circuit S500-R, being in the on-state, prevents isolation characteristics between the second transmission and reception terminal TRX21 and the transmission input terminal TXIN from being deteriorated.

The first and fifth series switches S100 and S500 illustrated in FIGS. 5, 6, and 7 have a T-shaped structure. However, in another embodiment illustrated in FIG. 8, in order to further improve isolation characteristics, first and fifth series switches may also be formed in a pi-shaped structure, such as a structure of a series switch S100'/S500' illustrated in FIG. 9, by further including a series switch circuit SR3 (FIG. 9) and a shunt switch circuit SH2 (FIG. 9).

Figure 8:
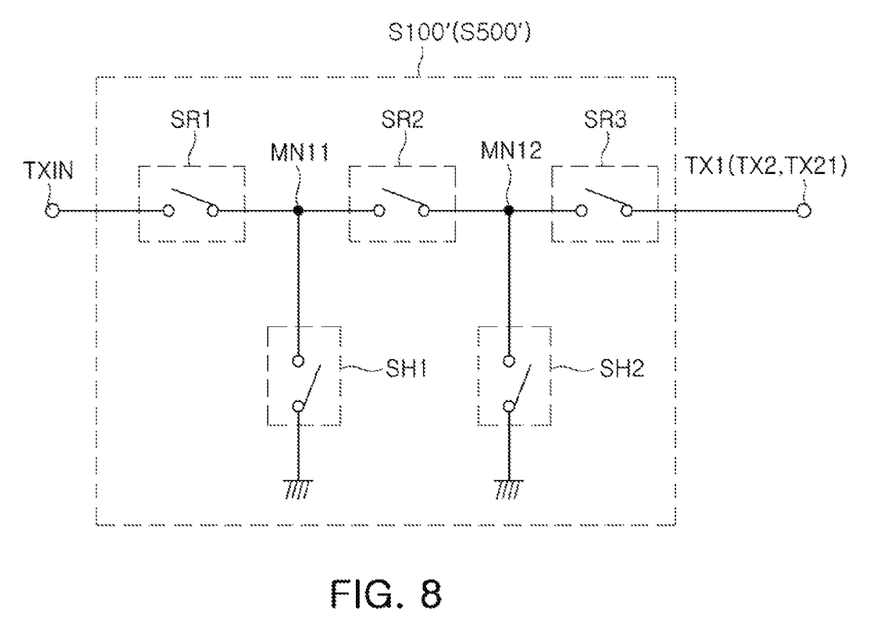
FIG. 8 is a diagram of a series switch which may be implemented as the first and fifth series switches, according to an embodiment.
Figure 9:
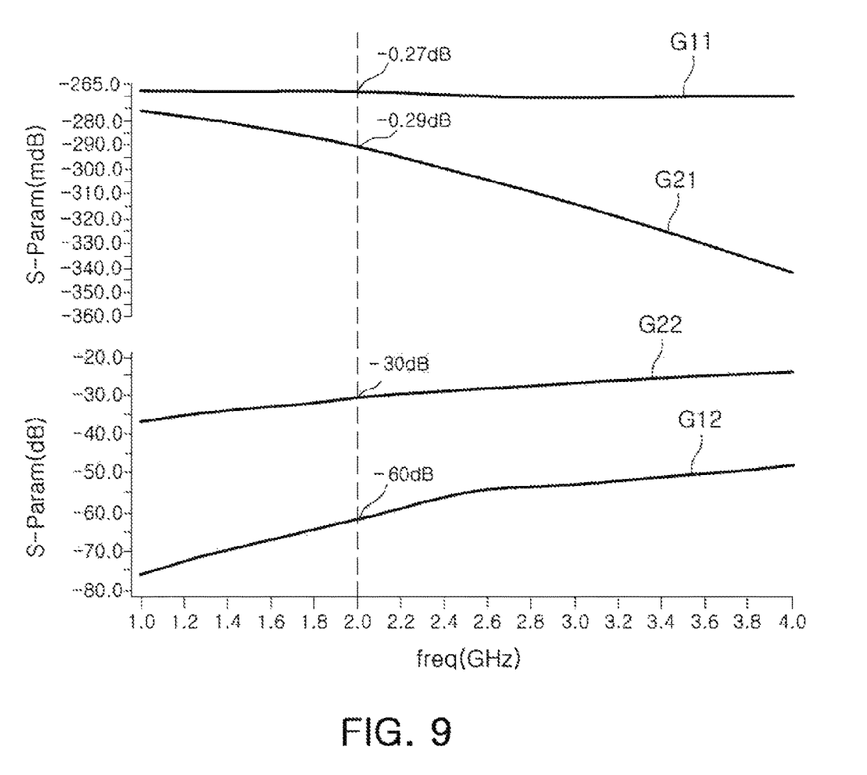
FIG. 9 is a diagram illustrating a simulation graph for insertion loss and isolation of the band selection switch apparatus of FIG. 3, according to an embodiment.

FIG. 8 is a diagram of the series switch S100' or S500', which may be used as the first and fifth series switches, respectively, according to an embodiment.

The series switch S100'/S500' illustrated in FIG. 8 is formed in a pi (π-shaped structure and may be used in place of the first series switch S100 or the fifth series switch S500. The series switch S100' or S500' of FIG. 9 includes a first series switch circuit SR1 connected in series between the transmission input terminal TXIN and the opposite terminal (one terminal of TX1, TX2, and TX21), a second series switch circuit SR2, and a third series switch circuit SR3. The series switch S100' or S500' further includes a first shunt switch circuit SH1 connected between a connection node MN11 between the first series switch circuit SR1 and the second series switch circuit SR2, and the ground, and a second shunt switch circuit SH2 connected between a connection node MN1 between the second series switch circuit SR2 and the third series switch circuit SR3, and the ground.

In a case in which the first or fifth series switch S100 or S500 having the T-shaped structure illustrated in FIGS. 2 through 7 is used, isolation is improved to −60 dB from −30 dB in comparison to the conventional series switch. In some cases, a specific PAM system may also require higher performance. Therefore, to this end, the series switch S100' or S500' having the pi (π-shaped structure illustrated in FIG. 8 may be applied, instead of the first or fifth series switch S100 or S500.

In a case of using the series switch S100' or S500' having the pi (π-shaped structure illustrated in FIG. 8, isolation performance is maintained at −70 dB or more. In FIG. 8, the first series switch circuit SR1 includes a number of stacks (e.g., switch elements) capable of withstanding high transmission TX power, and for example, the number of stacks is set to seven to eight stacks for the transmission TX power of about 34 dBm.

The third series switch circuit SR3 may include a number of stacks capable of withstanding the reception RX power, and for example, since the reception RX power is substantially smaller than the transmission power, it is sufficient that the third series switch circuit SR3 includes two stacks or more, but the third series switch circuit SR3 may include a larger number of stacks. As an example, in a case of determining a configuration of the third series switch circuit SR3, when the series switches are in the off state and the reception RX path is in the active (on) state, that is, when the signal path including the third series switch circuit SR3 between the first transmission and reception terminal TRX1 and the first reception output terminal RXOUT1 in FIG. 1 is in the active (on) state, in a case in which the number of stacks included in the third series switch circuit SR3 is small, since an off-capacitance is large and loss is large, the third series switch circuit SR3 includes four stacks, in consideration of the large off-capacitance and the large loss.

As described above, the number of stacks of the third series switch circuit SR3 may need to be determined by considering both an aspect of withstanding the reception RX power and an aspect of reception RX loss satisfying a specification.

In addition, a number of stacks of the second series switch circuit SR2 is set by considering isolation required by the system. As an example, in a case in which the isolation between terminals is −70 dB, the number of stacks of the second series switch circuit SR2 is set to two stacks. The number of stacks described above is merely illustrative, and the corresponding number of stacks may be changed (increased or decreased), as needed.

As described above, as an example, the first series switch circuit SR1, the second series switch circuit SR2, and the third series switch circuit SR3 include the number of stacks of 8:2:4, but are not limited to this configuration.

FIG. 9 is a diagram illustrating a simulation graph for insertion loss and isolation of the band selection switch apparatus 10' of FIG. 3, which is a double-pole triple-throw (DP3T) switch apparatus.

Referring to FIG. 9, G11 and G12 are insertion and isolation graphs for the band selection switch apparatus 10' (e.g., in a case of including the switch element of ten stacks) of FIG. 3, according to an embodiment. G21 and G22 are insertion loss and isolation graphs for a conventional band selection switch apparatus DP3T.

Referring to G11 and G21, it can be seen that the insertion loss is improved to −0.27 dB from −0.29 dB. Referring to G12 and G22, it can be seen that the isolation is significantly improved to −61 dB from −30 dB.

According to the embodiments described above, a band selection switch apparatus of a power amplifier system is capable of improving insertion loss characteristics of each of two signal paths, which simultaneously enter an on-state, and isolation characteristics between the two signal paths.

As set forth above, according to the disclosed embodiments, in a switch structure switching multiple bands, the insertion loss characteristics of each of the two signal paths which simultaneously enter the active state (e.g., the on-state) are improved, and the isolation characteristics between the two signal paths are improved.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A band selection switch apparatus, comprising:
   a first switch comprising a first series switch disposed between a transmission input terminal and a first transmission and reception terminal;
   a second switch comprising a second series switch disposed between the transmission input terminal and a first transmission terminal; and a third switch comprising a third series switch disposed between a first reception output terminal and the first transmission and reception terminal, wherein the first series switch comprises
- a first series switch circuit comprising first series switch elements connected between the transmission input terminal and a first intermediate node;
- a second series switch circuit comprising second series switch elements connected between the first intermediate node and the first transmission and reception terminal and configured to perform a switching operation in synchronization with a switching operation performed by the first series switch circuit; and
- a first shunt switch circuit comprising first shunt switch elements connected between the first intermediate node and a ground and configured to perform a switching operation complementarily with the switching operation performed by the first series switch circuit.

2. The band selection switch apparatus of claim 1, wherein
- the first series switch elements comprise first to n-th switch elements connected to each other in series, and comprising a withstand voltage that is higher than a voltage corresponding to a transmission power of the transmission input terminal in an off-state, and
- the second series switch elements comprise first to m-th switch elements connected to each other in series, and comprising a withstand voltage that is higher than a voltage corresponding to a reception power of the transmission and reception terminal in the off-state.

3. The band selection switch apparatus of claim 1, wherein the first shunt switch elements comprise first to k-th switch elements connected to each other in series, and comprising a withstand voltage that is higher than a voltage corresponding to a transmission power of the transmission input terminal in an off-state.

4. The band selection switch apparatus of claim 1, wherein
- the first series switch elements comprise first to n-th switch elements connected to each other in series,
- the second series switch elements comprise first to m-th switch elements connected to each other in series,
- m is a natural number of two or more, and
- n is a natural number greater than m.

5. The band selection switch apparatus of claim 1, wherein the first series switch further comprises
- a third series switch circuit comprising third series switch elements connected between the second series switch circuit and the first transmission and reception terminal, and configured to perform the switching operation in synchronization with the switching operation performed by the first series switch circuit, and
- a second shunt switch circuit comprising second shunt switch elements connected between a connection node between the second series switch circuit and the third series switch circuit, and the ground, and configured to perform the switching operation complementarily with the switching operation performed by the first series switch circuit.

6. The band selection switch apparatus of claim 5, wherein
- the first series switch elements comprise first to n-th switch elements connected to each other in series,
- the second series switch elements comprise first to m-th switch elements connected to each other in series,
- n is a natural number of two or more, and
- m is a natural number greater than n.

7. The band selection switch apparatus of claim 1, further comprising:
- a fourth switch comprising a fourth series switch connected between the transmission input terminal and a second transmission and reception terminal; and
- a fifth series switch connected between the first reception output terminal and the second transmission and reception terminal, wherein the fifth series switch comprises
- a fifth series switch circuit comprising fifth series switch elements connected between the first reception output terminal and a second intermediate node,
- a sixth series switch circuit comprising sixth series switch elements connected between the second intermediate node and the second transmission and reception terminal, and configured to perform the switching operation in synchronization with the switching operation performed by the first series switch circuit, and
- a fifth shunt switch circuit comprising fifth shunt switch elements connected between the second intermediate node and the ground and configured to perform the switching operation complementarily with the switching operation performed by the first series switch circuit.

8. The band selection switch apparatus of claim 7, wherein the first series switch elements comprise first to n-th switch elements connected to each other in series, and comprising a withstand voltage that is higher than a voltage corresponding to a reception power of the first reception output terminal in an off-state, and wherein n is a natural number.

9. The band selection switch apparatus of claim 7, wherein the second series switch elements comprise first to m-th switch elements connected to each other in series, and comprising a withstand voltage that is higher than a voltage corresponding to transmission power of the second transmission and reception terminal in an off-state, and wherein m is a natural number.

10. The band selection switch apparatus of claim 7, wherein the first shunt switch elements comprise first to k-th switch elements connected to each other in series, and comprising a withstand voltage that is higher than a voltage corresponding to transmission power of the second transmission and reception terminal in an off-state, and wherein k is a natural number.

11. A band selection switch apparatus, comprising:
- a first switch comprising a first series switch disposed between a transmission input terminal and a first transmission and reception terminal;
- a second switch comprising a second series switch disposed between the transmission input terminal and a first transmission terminal;
- a third switch comprising a third series switch disposed between a first reception output terminal and the first transmission and reception terminal;
- a fourth switch comprising a fourth series switch connected between the transmission input terminal and a second transmission and reception terminal;
- a fifth series switch connected between the first reception output terminal and the second transmission and reception terminal; and
- a fifth switch comprising a sixth series switch disposed between a second reception output terminal and the second transmission and reception terminal, wherein the fifth series switch comprises
- a first series switch circuit comprising first series switch elements connected between the first reception output terminal and a second intermediate node, a second series switch circuit comprising second series switch elements connected between the second intermediate node and the second transmission and reception terminal, and configured to perform a switching operation in synchronization with a switching operation performed by the first series switch circuit, and a first shunt switch circuit comprising first shunt switch elements connected between the second intermediate node and a ground, and configured to perform a switching operation complementarily with the switching operation performed by the first series switch circuit.

12. The band selection switch apparatus of claim 11, wherein the first series switch elements comprise first to n-th switch elements connected to each other in series, and comprising a withstand voltage that is higher than a voltage corresponding a reception power of the first reception output terminal in an off-state, the second series switch elements comprise first to m-th switch elements connected to each other in series, and comprising a withstand voltage that is higher than a voltage corresponding to a transmission power of the second transmission and reception terminal in the off-state, the first shunt switch elements comprise first to k-th switch elements connected to each other in series, and comprising the withstand voltage that is higher than the voltage corresponding the transmission power of the second transmission and reception terminal in the off-state, and n, m, and k are natural numbers.

13. The band selection switch apparatus of claim 11, wherein the first series switch elements comprise first to n-th switch elements connected to each other in series, the second series switch elements comprise first to m-th switch elements connected to each other in series, n is a natural number of two or more, and m is a natural number greater than n.

14. The band selection switch apparatus of claim 11, wherein the fifth series switch further comprises a third series switch circuit comprising third series switch elements connected between the second series switch circuit and the second transmission and reception terminal, and configured to perform a switching operation in synchronization with the switching operation performed by the first series switch circuit, and a second shunt switch circuit comprising second shunt switch elements connected between a connection node between the second series switch circuit and the third series switch circuit, and the ground, and configured to perform a switching operation complementarily with the switching operation of the first series switch circuit.

15. The band selection switch apparatus of claim 11, wherein the transmission input terminal is connected to a power amplifier, the first reception output terminal and the second reception output terminal are connected to a low noise amplifier, and the first transmission and reception terminal and the first transmission terminal are connected to a filter circuit.

16. The band selection switch apparatus of claim 11, wherein the first transmission and reception terminal is configured to transmit and receive signals in a first band, the second transmission and reception terminal is configured to transmit and receive signals in a second band, and the first transmission terminal is configured to transmit signals in a third band.

* * * * *